United States Patent

Ozawa

[11] Patent Number: 5,870,344
[45] Date of Patent: *Feb. 9, 1999

[54] SEMICONDUCTOR MEMORY DEVICE

[75] Inventor: Takashi Ozawa, Kasugai, Japan

[73] Assignee: Fujitsu Limited, Kanagawa, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 799,209

[22] Filed: Feb. 13, 1997

[30] Foreign Application Priority Data

Mar. 14, 1996 [JP] Japan ..................... 8-058006

[51] Int. Cl.$^6$ ........................................ G11C 7/00
[52] U.S. Cl. ..................... 365/205; 365/207; 365/194; 365/230.03
[58] Field of Search .................. 365/205, 207, 365/194, 230.03, 189.01; 327/51

[56] References Cited

U.S. PATENT DOCUMENTS

| 4,748,596 | 5/1988 | Ogura et al. ..................... 365/205 |
| 5,088,065 | 2/1992 | Hanamura et al. ................. 365/205 X |
| 5,274,598 | 12/1993 | Fujii et al. ........................ 365/207 X |
| 5,293,338 | 3/1994 | Ihara ................................ 365/194 |
| 5,517,461 | 5/1996 | Unno et al. ..................... 365/189.01 X |
| 5,602,774 | 2/1997 | Elrabaa et al. ..................... 365/205 X |
| 5,627,789 | 5/1997 | Kalb, Jr. ........................... 365/205 |
| 5,627,793 | 5/1997 | McClure ........................... 365/194 X |
| 5,646,897 | 7/1997 | Yukutake et al. ................... 365/205 |

*Primary Examiner*—Huan Hoang
*Attorney, Agent, or Firm*—Nikaido Marmelstein Murray & Oram, LLP

[57] ABSTRACT

A semiconductor memory device has a memory cell array having a plurality of memory cells connected to multiple word lines and between multiple pairs of bit lines. A main sense amplifier reads cell information onto a pair of bit lines from one memory cell selected via a word line and outputs the read cell information after amplification. A pre-sense amplifier, connected to each pair of bit lines, amplifies a potential difference between the pair of bit lines based on the cell information and outputs the amplified potential difference to the main sense amplifier prior to outputting of the read data.

22 Claims, 5 Drawing Sheets operation timing of conventional SRAM operation timing of SRAM

SEMICONDUCTOR MEMORY DEVICE

BACKGROUND OF THE INVENTION

1. Field of the Invention

The present invention relates to a data reading circuit for a semiconductor memory device.

2. Description of the Related Art

The integration and operation speed of recent semiconductor memory devices has become higher and faster, respectively, and a great effort has been made to reduce their supply voltage in order to ensure lower power consumption. A data reading circuit for use in such a semiconductor memory device should have a faster reading speed without failing to reduce the supply voltage.

FIG. 1 illustrates an SRAM of a pulse word type, which selects a word line in synchronism with a clock signal. A pulse generator 1 generates an internal clock signal CLK based on an input external clock signal CK. A column decoder 2 sends a column select signal to a column selector 3 based on a column address signal ADc which is input externally.

A row decoder 4 receives the clock signal CLK and a row address signal ADr. When the clock signal CLK goes to an H (High) level, for example, the row decoder 4 selects one of multiple word lines WL based on the row address signal ADr.

Memory cells C are connected to each of the word lines WL and between individual pairs of bit lines BL and /BL. Based on the word line WL selected, cell information is read from the memory cells C, connected to the selected word line WL, to the individual pairs of bit lines BL and /BL.

The column selector 3 selects one pair from plural pairs of bit lines BL and /BL based on the column select signal and transfers the cell information read on this bit line pair BL and /BL to data buses DB and /DB. A main sense amplifier 5 amplifies the cell information output onto the data buses DB and /DB and outputs the amplified information as data OUT and /OUT.

The aforementioned clock signal CLK is input to a precharge circuit 6, which is provided between each pair of bit lines BL and /BL. When no word line WL is selected, i.e., when the clock signal CLK has an L (Low) level, the precharge circuit 6 is enabled and the potential of each bit line pair is reset to $V_{cc}/2$, for example, where $V_{cc}$ is a high-potential voltage supply.

To increase the memory capacity of this SRAM, the memory cell array becomes miniaturized more and more. The miniaturization of the memory cells C decreases the load drive performance of the memory cells C. The micronization of the memory cell array has resulted in a greater parasitic capacitance and greater parasitic resistance of the bit lines BL and /BL.

To drive the bit lines BL and /BL with large parasitic loads by the memory cells C having a smaller load drive performance and to improve the reading speed, the amplitude of cell information to be read on the bit lines BL and /BL may be suppressed, and a differential amplifier having a high input sensitivity may be used for the main sense amplifier 5.

FIG. 2 shows a main sense amplifier 5a for use in an SRAM, the bit lines BL and /BL of which are driven by cell information with a small amplitude. The bit lines BL and /BL are connected to the high-potential voltage supply $V_{cc}$ via respective load resistors R1. The resistance of each load resistor R1 is set so as to suppress the amplitude of the bit lines BL and /BL to approximately 100 mV to 50 mV by voltage-dividing the supply voltage $V_{cc}$ by this load resistance R1 and the ON resistance of the transistor that constitutes each memory cell C.

In the main sense amplifier 5a, NPN transistors Tr1 and Tr2 have their bases respectively connected to the data buses DB and /DB and collectors connected via respective resistors R2 to the voltage supply $V_{cc}$.

The emitters of the transistors Tr1 and Tr2 are connected to a low-potential voltage supply $V_{ss}$ via an N channel MOS transistor Tr3, the gate of which is supplied with an enable signal LE via an inverter circuit 6a. Read data OUT and /OUT are output from the collectors of the transistors Tr1 and Tr2.

If the main sense amplifier 5a is constituted by a differential amplifier comprised of bipolar transistors as in this case, when the enable signal LE becomes an L level, the transistor Tr3 is turned on to enable the main sense amplifier 5a. Consequently, the minute potential difference between the data buses DB and /DB originated from the read cell information is amplified by the operation of the transistors Tr1 and Tr2 and is output as the read data OUT and /OUT.

As the supply voltage $V_{cc}$ gets lower, the input sensitivity of this main sense amplifier 5a falls. The resistance of the load resistor R1 for setting the amplitude of the bit lines should be set in accordance with a change in the supply voltage $V_{cc}$ or changes in the parasitic capacitance and parasitic resistance of the bit lines. Further, it is very troublesome and practically difficult to set the resistance of the load resistor R1 so that the amplitude of the bit lines BL and /BL is optimized in accordance with the input sensitivity of the main sense amplifier 5a.

In view of the above, one structure has been proposed that allows the memory cells C to effect the full amplitude operation of the bit lines BL and /BL according to the potential difference between the high-potential voltage supply $V_{cc}$ and the low-potential voltage supply $V_{ss}$ based on the operation of reading cell information from the memory cells C.

FIG. 3 shows the specific structure of a main sense amplifier 5b, which is used in this type of bit line full amplitude system. In this main sense amplifier 5b, a differential amplifier is comprised of MOS transistors. P channel MOS transistors Tr4 and Tr5 have sources connected to the high-potential voltage supply $V_{cc}$ and gates connected together to the drain of the transistor Tr4 and the drain of an N channel MOS transistor Tr6.

The transistor Tr6 has a gate connected to the data bus DB and a source connected to the drain of an N channel MOS transistor Tr8. The transistor Tr5 has a drain connected to the drain of an N channel MOS transistor Tr7, the gate of which is connected to the data bus /DB. The source of the transistor Tr7 is connected to the drain of the transistor Tr8.

The enable signal LE is input via an inverter circuit 6b to the gate of the transistor Tr8, the source of which is connected to the low-potential voltage supply $V_{ss}$. An output signal OUT is output from the drains of the transistors Tr5 and Tr7, and an output signal /OUT is output from the drains of the transistors Tr4 and Tr6.

While the potentials of the bit lines BL and /BL are increased to the potential difference between the high-potential voltage supply $V_{cc}$ and the low-potential voltage supply $V_{ss}$, the main sense amplifier 5b operates and outputs the output signals OUT and /OUT with full amplitudes when the amplitudes of the potentials of the bit lines BL and /BL become equal to or higher than a predetermined value. While the main sense amplifier 5b operates slower than the main sense amplifier 5a shown in FIG. 2, it can secure the operational margin with respect to the low supply voltage more easily.

The data reading operation for an SRAM of such a bit line full amplitude system will now be discussed with reference to FIG. 4. Assume that the individual bit lines BL and /BL are precharged to $V_{cc}/2$, and specific bit lines BL and /BL are selected by the column selector 3 based on the column select signal. When the clock signal CLK goes high in this situation, a specific word line WL selected by the row decoder 4 based on the row address signal ADr goes high.

Consequently, cell information is read to the bit lines BL and /BL from the memory cell C selected by that word line WL producing a potential difference between the bit lines BL and /BL. This potential difference gradually increases.

When the enable signal LE falls to an L level to enable the main sense amplifier 5b, the main sense amplifier 5b amplifies the potential difference between the bit lines BL and /BL and inverts the read data OUT and /OUT with the full amplitudes, for example.

When the clock signal CLK falls to an L level, the selected word line WL goes low from the H level and the potentials of the bit lines BL and /BL are reset to $V_{cc}/2$ by the precharge circuit 6.

In the SRAM of the bit line full amplitude system, the micronization of the memory cell array reduces the load drive performance of each memory cell C and increases the parasitic capacitances and parasitic resistances of the bit lines BL and /BL. This elongates the time from the rising of the word line WL to the H level to the point where the amplitudes of the bit lines BL and /BL become high enough to satisfy the input sensitivity of the main sense amplifier 5b based on the operation of the memory cells C. Therefore, the data reading speed cannot be increased sufficiently, disadvantageously.

SUMMARY OF THE INVENTION

Accordingly, it is an objective of the present invention to provide a semiconductor memory device that can permit the miniaturization of the memory cell array and can have an improved data reading speed in the full amplitude operation of bit lines in a data read mode.

To achieve this object, a semiconductor memory device according to this invention has a memory cell array having a plurality of memory cells connected to multiple word lines and between multiple pairs of bit lines. A main sense amplifier reads cell information onto a pair of bit lines from one memory cell selected via a word line and outputs the read cell information after amplification. A pre-sense amplifier, connected to each pair of bit lines, amplifies a potential difference between the pair of bit lines based on the cell information and outputs the amplified potential difference to the main sense amplifier prior to outputting of the read data.

When cell information is read onto a pair of bit lines from a memory cell in this semiconductor memory device, a slight potential difference is produced between the bit line pair. Consequently, the pre-sense amplifier is enabled to amplify the potential difference between the bit line pair. Based on the amplified potential difference, the main sense amplifier operates and outputs the read cell information as read data.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENT

Figure 1:
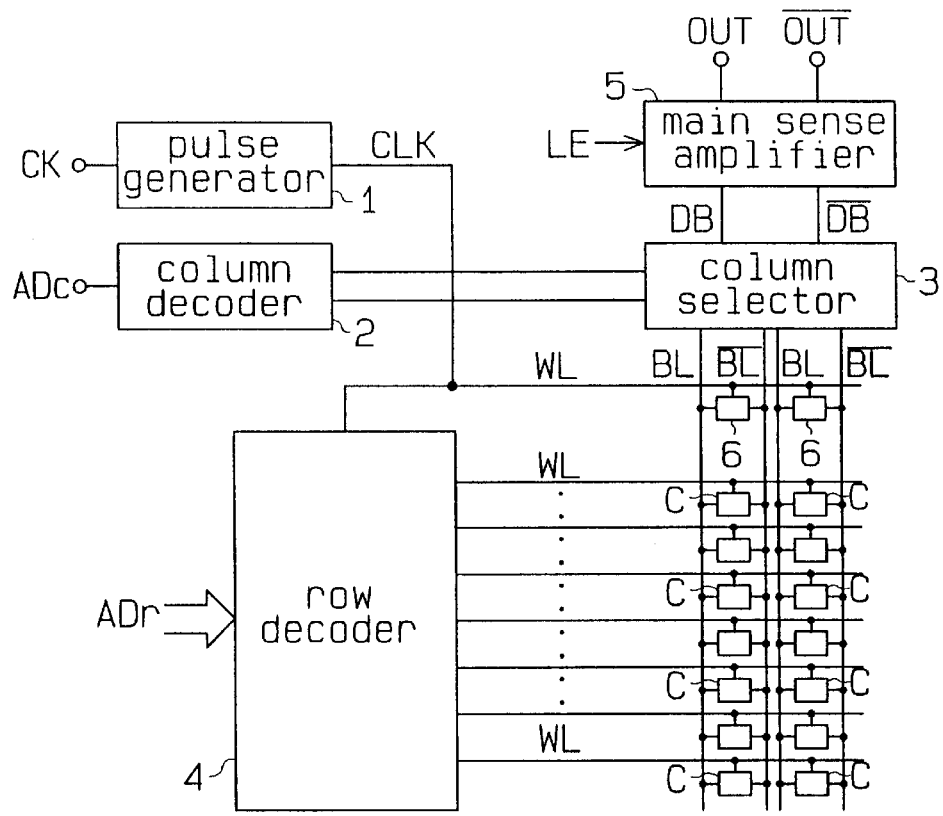
FIG. 1 is a circuit diagram showing prior art.
Figure 2:
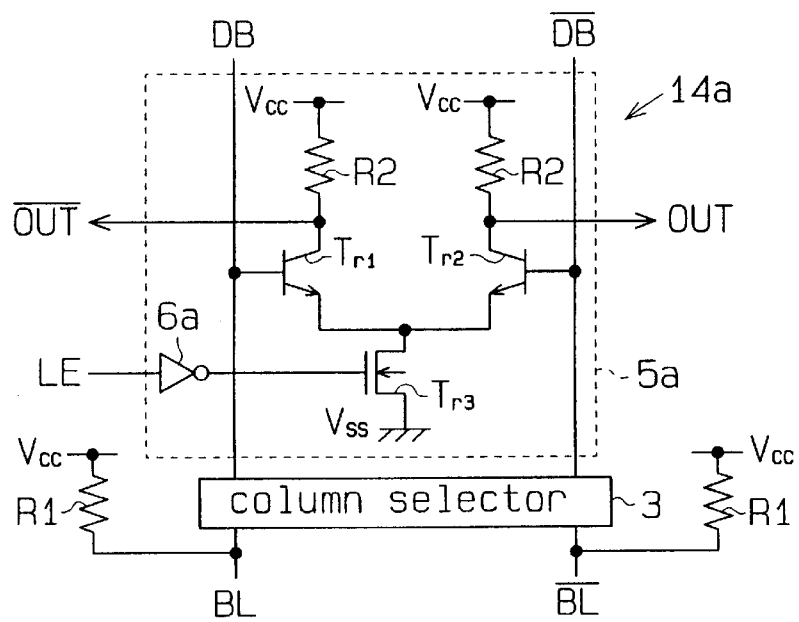
FIG. 2 is a circuit diagram showing a main sense amplifier according to the prior art.
Figure 3:
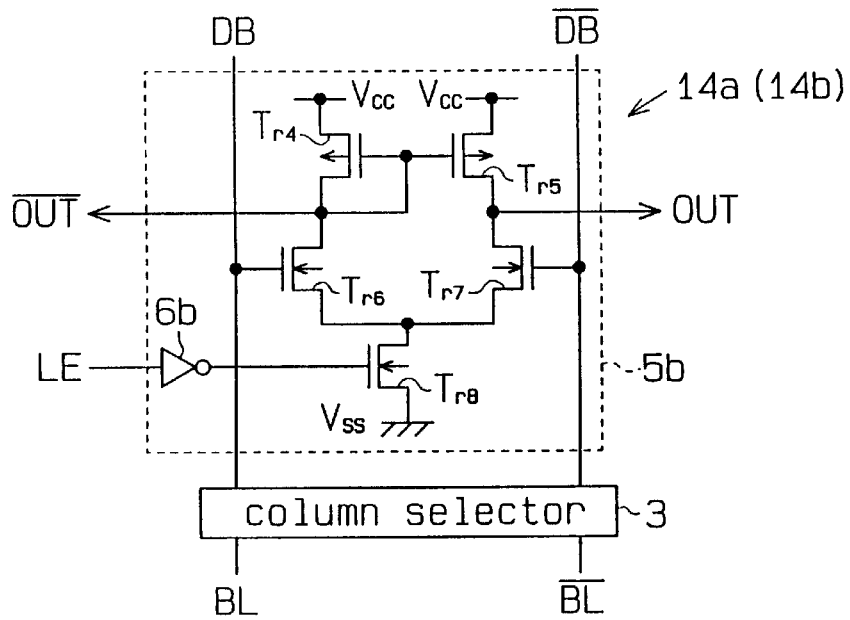
FIG. 3 is a circuit diagram showing a main sense amplifier according to another prior art.
Figure 4:
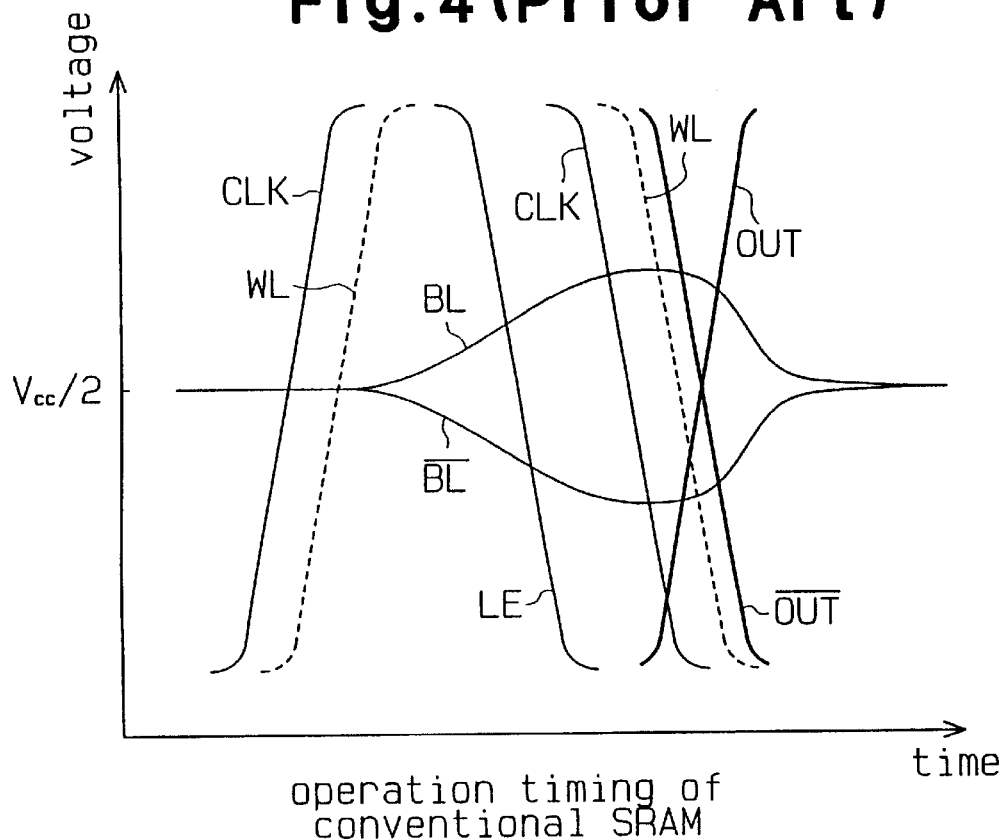
FIG. 4 is a timing waveform chart illustrating the operation of the conventional circuit.
Figure 5:
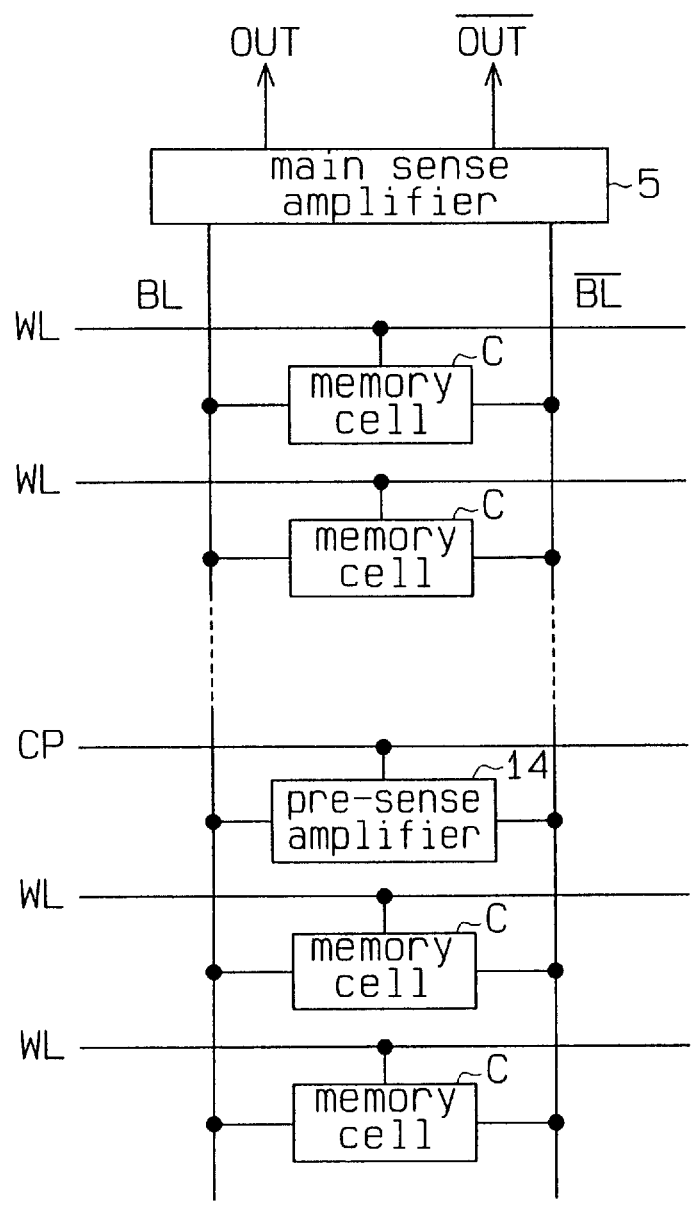
FIG. 5 is an explanatory diagram showing the outline of this invention.

FIG. 5 presents an explanatory diagram showing the outline of this invention. The memory cell array has multiple word lines WL and multiple pairs of bit lines BL and /BL and memory cells C connected to the individual word lines WL and between the pairs of bit lines BL and /BL. Cell information is read from a memory cell C, selected by a word line WL, onto the associated pair of bit lines BL and /BL. A pre-sense amplifier 14 is connected to each pair of bit lines BL and /BL.

When cell information is read from a memory cell C onto the associated pair of bit lines BL and /BL, a slight potential difference is produced between the bit line pair BL and /BL. Consequently, the pre-sense amplifier 14 is enabled to amplify the potential difference between the bit line pair BL and /BL. Based on the amplified potential difference, a main sense amplifier 5 operates and outputs the read cell information as read data OUT and /OUT.

Figure 6:
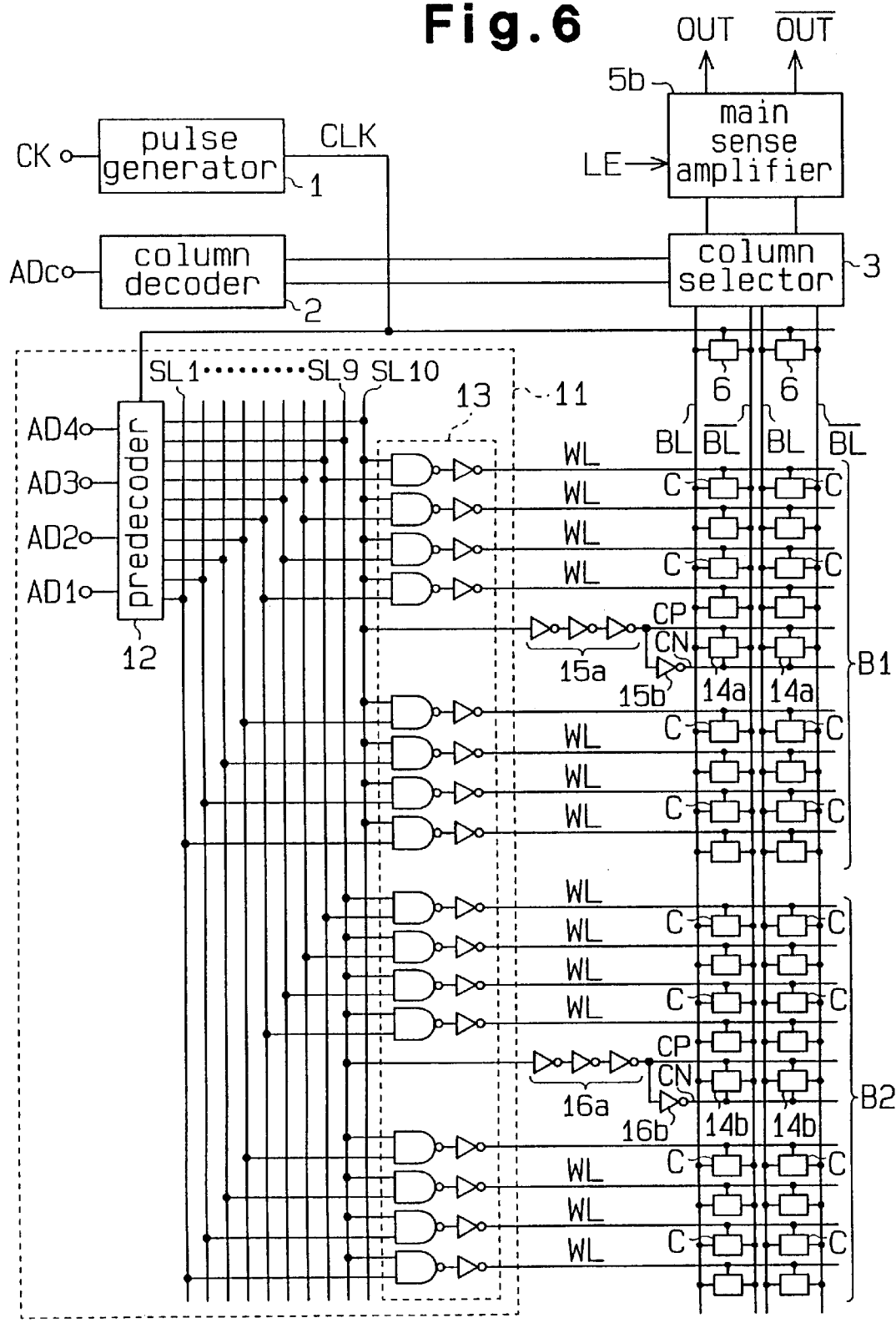
FIG. 6 is a circuit diagram depicting one embodiment of this invention.

FIG. 6 illustrates one embodiment of a pulse word type SRAM embodying this invention. For simplicity of the description, it is assumed that one of sixteen word lines WL is selected by a row decoder 11 based on 4-bit row address signals AD1 to AD4.

A pulse generator 1, a column decoder 2, a column selector 3, a main sense amplifier 5b and a precharge circuit 6 have the same structures as those of the prior art. The row decoder 11 comprises a predecoder 12 and a word line driver 13. The predecoder 12 outputs ten select signals SL1 to SL10 based on the row address signals AD1–AD4. One of the eight select signals SL1–SL8 among the ten select signals goes high based on the row address signals AD1–AD3. One of the remaining two select signals SL9 and SL10 goes high based on the row address signal AD4.

The word line driver 13 causes one of the sixteen word lines WL to go high based on the select signals SL1–SL10. The memory according to this embodiment has two pairs of bit lines BL and /BL. The sixteen memory cells C connected to each pair of bit lines BL and /BL form two blocks B1 and B2 each including eight memory cells C. The memory of this embodiment therefore has a total of four blocks. Pre-sense amplifiers 14a and 14b are connected between the row decoder 11 and each bit line pair BL and /BL at the intermediate parts of the blocks B1 and B2.

Three stages of first inverter circuits 15a, which constitute a first delay circuit, are connected to the pre-sense amplifier 14a. The select signal SL10 is converted by the first inverter circuit 15a to a first control signal CP, which is, in turn input to the pre-sense amplifier 14a. This first control signal CP is converted by a 1-stage second inverter circuit 15b to a second control signal CN, which is, in turn input to the pre-sense amplifier 14a.

Likewise, three stages of first inverter circuits 16a, which constitute a first delay circuit, are connected to the pre-sense amplifier 14b. The select signal SL9 is converted by the first inverter circuit 16a to a first control signal CP, which is, in turn, input to the pre-sense amplifier 14b. This first control signal CP is converted by a 1-stage second inverter circuit 16b to a second control signal CN, which is, in turn, input to the pre-sense amplifier 14b.

Figure 7:
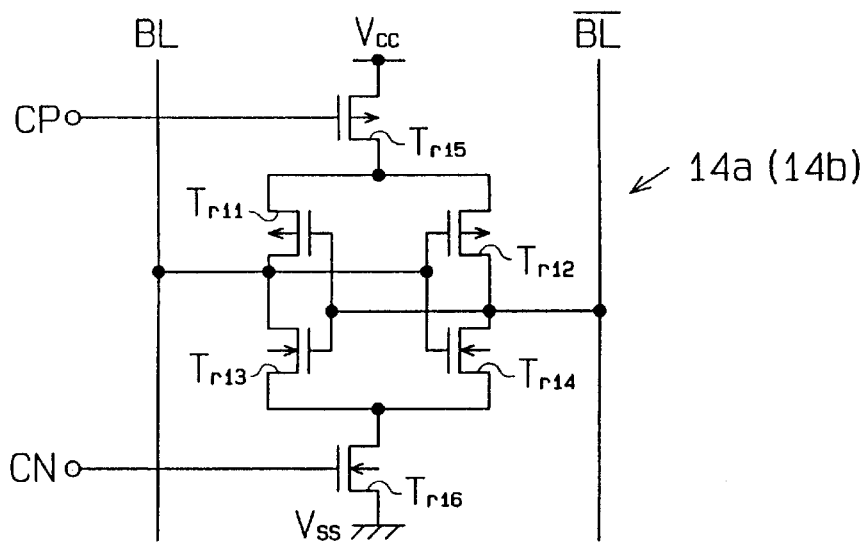
FIG. 7 is a circuit diagram showing a pre-sense amplifier in the circuit in FIG. 6.

The pre-sense amplifiers 14a and 14b have the same structure, which is exemplified in FIG. 7. The pre-sense amplifier 14a (14b) is constituted of a flip-flop circuit having two CMOS inverter circuits connected in loop. The drains of transistors Tr11 and Tr13 and the gates of transistors Tr12 and Tr14 are connected to the bit line BL, and the gates of the transistors Tr11 and Tr13 and the drains of the transistors Tr12 and Tr14 are connected to the bit line /BL.

The sources of the transistors Tr11 and Tr12 are connected via a P channel MOS transistor Tr15 to the high-potential voltage supply $V_{cc}$, and the sources of the transistors Tr13 and Tr14 are connected via an N channel MOS transistor Tr16 to the low-potential voltage supply $V_{ss}$. The first control signal CP is input to the gate of the transistor Tr15, and the second control signal CN is input to the gate of the transistor Tr16.

When the first control signal CP goes low and the second control signal CN goes high, the thus constituted pre-sense amplifiers 14a and 14b are enabled to increase the potential difference between the bit line pair BL and /BL. When the first control signal CP goes high and the second control signal CN goes low, on the other hand, the pre-sense amplifiers 14a and 14b are disabled.

Figure 8:
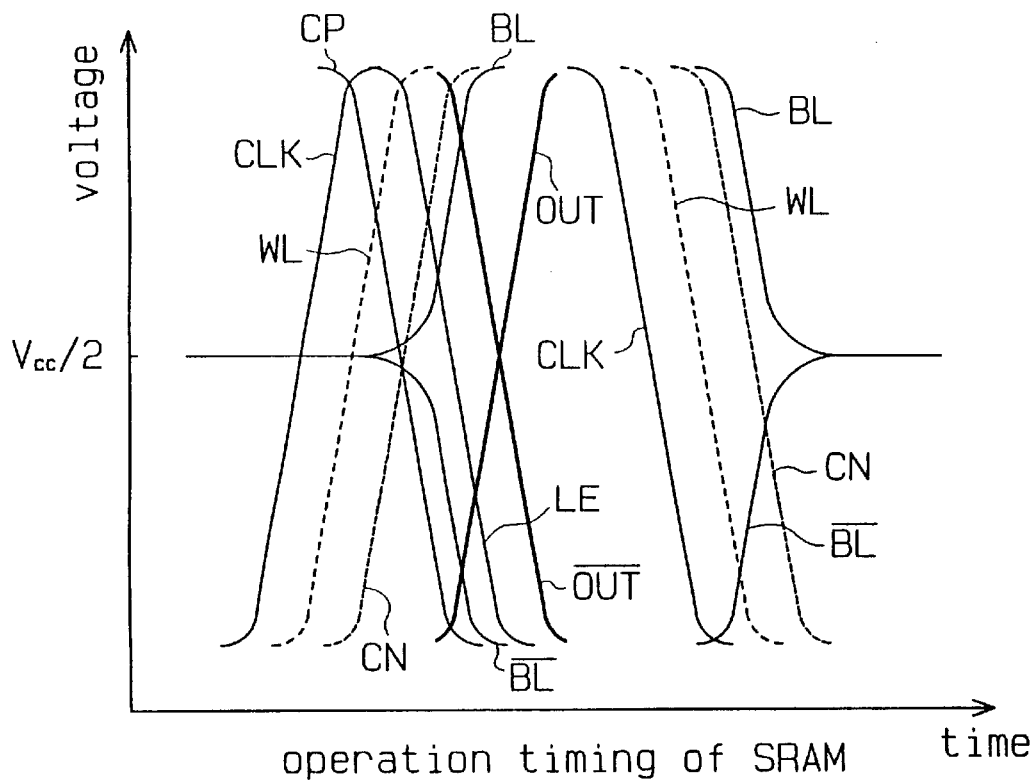
FIG. 8 is a timing waveform chart illustrating the operation of the circuit in FIG. 6.

The data reading operation of the SRAM with the above-described structure of such a bit line full amplitude system will now be discussed with reference to FIG. 8. Assume that the individual bit lines BL and /BL are precharged to $V_{cc}/2$ and specific bit lines BL and /BL are selected by the column selector 3 based on a column select signal. When a clock signal CLK goes high in this situation, a specific word line WL selected by the row decoder 11 based on a row address signal goes high.

Consequently, cell information is read onto the associated bit lines BL and /BL from the memory cell C selected by that word line WL, producing a potential difference between the bit lines BL and /BL. When any word line WL corresponding to the block B1 is selected, for example, the select signal SL10 goes high. As a result, the first control signal CP goes low and the second control signal CN goes high after a delayed operation timing caused by the first inverter circuits 15a. Consequently, the pre-sense amplifier 14a is enabled to increase the potential difference between the bit line pair BL and /BL.

Then, an enable signal LE goes low to enable the main sense amplifier 5b. Since the potential difference between the bit lines BL and /BL is increased to a sufficient level to initiate the amplification of the main sense amplifier 5b at this time, the main sense amplifier 5b promptly starts the amplification and outputs the read data OUT and /OUT.

When a word line WL corresponding to the block B2 is selected, on the other hand, the pre-sense amplifier 14b is enabled to amplify the cell information read onto the bit line pair BL and /BL after a time delay caused by the first inverter circuits 16a.

Then, based on the potential difference between the bit lines BL and /BL, which has been amplified by the pre-sense amplifier 14b, the main sense amplifier 5b promptly operates to output the read data OUT and /OUT.

When the clock signal CLK goes low, the selected word line WL goes low from the H level and the potentials of the bit lines BL and /BL are reset to $V_{cc}/2$ by the precharge circuit 6.

This SRAM of the bit line full amplitude system has the following advantages.

When a specific word line WL is selected and cell information is read onto the associated bit lines BL and /BL from the memory cell C selected by this word line WL, the pre-sense amplifier provided in the block to which the selected word line WL belongs operates to amplify a slight potential difference between the bit lines BL and /BL. After the potential difference between the potential difference is increased to a sufficient level, the main sense amplifier operates and outputs the read data OUT and /OUT.

Even if the load drive performance of each memory cell C is reduced or the parasitic capacitance and parasitic resistance of the bit lines BL and /BL are increased due to the micronization of the memory cell array, therefore, the pre-sense amplifier located close to the selected memory cell C quickly increases the potential difference between the bit lines BL and /BL to the level that sufficiently satisfies the input sensitivity of the main sense amplifier 5b. Based on the increased potential difference, the main sense amplifier 5b promptly operates. It is therefore possible to sufficiently improve the data reading speed.

After the selection of the word line WL, the pre-sense amplifier 14a or 14b is enabled with a delayed operation timing caused by the inverter circuits 15a or the inverter circuit 15b. Accordingly, the pre-sense amplifier 14a or 14b can be enabled after cell information is read onto the associated bit lines BL and /BL from the selected memory cell C, thereby positively preventing erroneous data reading.

Although only one embodiment of the present invention has been described herein, it should be apparent to those skilled in the art that the present invention may be embodied in many other specific forms without departing from the spirit or scope of the invention. Particularly, it should be understood that at least one pre-sense amplifier is needed for each pair of bit lines BL and /BL.

A plurality of pre-sense amplifiers to be connected to the respective pairs of bit lines BL and /BL may be designed in such a manner that the greater the distance of each pre-sense amplifier from the main sense amplifier becomes, the load drive performance of that pre-sense amplifier becomes greater. This structure can allow the transfer time of the output signal of a pre-sense amplifier located far from the main sense amplifier to become equal to the transfer time of the output signal of a pre-sense amplifier located close to the main sense amplifier. This structure may be adapted to other types of semiconductor memory devices such as DRAM.

Therefore, the present examples and embodiment are to be considered as illustrative and not restrictive and the invention is not to be limited to the details given herein, but may be modified within the scope of the appended claims.

What is claimed is:

1. A semiconductor memory device including a memory cell array having a plurality of memory cells connected to multiple word lines and between multiple pairs of bit lines, said semiconductor memory device comprising:

a main sense amplifier for reading cell information onto a pair of said bit lines from one memory cell selected via each word line and for outputting the read cell information after amplification; and a pre-sense amplifier, connected to each pair of bit lines, for amplifying a potential difference between the pair of bit lines based on the cell information and for outputting the amplified potential difference to the main sense amplifier prior to outputting of the read data, wherein said plurality of memory cells are divided into a predetermined number of blocks, each block having said pre-sense amplifier that is enabled to amplify the potential difference between the pair of bit lines when the memory cell in each block is selected, wherein said pre-sense amplifier is connected to the memory cells in the block via the pair of bit lines and has a delay circuit for outputting a signal with a delay used for selecting the memory cell in said block, in response to the output of the delay circuit said pre-sense amplifier being enabled or disabled, and wherein said main sense amplifier is enabled after said pre-sense amplifier is enabled.

2. A semiconductor memory device including a memory cell array having a plurality of memory cells connected to multiple word lines and between multiple pairs of bit lines, said semiconductor memory device comprising:

a main sense amplifier for reading cell information onto a pair of said bit lines from one memory cell selected via each word line and for outputting the read cell information after amplification; and a pre-sense amplifier, connected to each pair of bit lines, for amplifying a potential difference between the pair of bit lines based on the cell information and for outputting the amplified potential difference to the main sense amplifier prior to outputting of the read data, wherein said plurality of memory cells are divided into a predetermined number of blocks, each block having said pre-sense amplifier that is enabled to amplify the potential difference between the pair of bit lines when the memory cell in each block is selected and wherein said pre-sense amplifier is connected to the memory cells in the block via the pair of bit lines and has a delay circuit for outputting a signal with a delay used for selecting the memory cell in said block, in response to the output of the delay circuit, said pre-sense amplifier being enabled or disabled.

3. The semiconductor memory device according to claim 2, wherein said pre-sense amplifier includes a flip-flop circuit having two CMOS inverter circuits connected in loop.

4. A semiconductor memory device including a memory cell array having a plurality of memory cells connected to multiple word lines and between multiple pairs of bit lines, said semiconductor memory device comprising:

a main sense amplifier for reading cell information onto a pair of said bit lines from one memory cell selected via each word line and for outputting the read cell information after amplification; and a pre-sense amplifier, connected to each pair of bit lines, for amplifying a potential difference between the pair of bit lines based on the cell information and for outputting the amplified potential difference to the main sense amplifier prior to outputting of the read data, wherein said plurality of memory cells are divided into a predetermined number of blocks, each block having said pre-sense amplifier that is enabled to amplify the potential difference between the pair of bit lines when the memory cell in each block is selected; and wherein as a distance of each pre-sense amplifier from the main sense amplifier becomes greater, a load drive performance of the pre-sense amplifier becomes greater.

5. The semiconductor memory device according to claim 4, wherein said pre-sense amplifier includes a flip-flop circuit having two CMOS inverter circuits connected in loop.

6. The semiconductor memory device according to claim 4, wherein said pre-sense amplifier is connected to the memory cells in the block via the pair of bit lines and has a delay circuit for outputting a signal with a delay used for selecting the memory cell in said block, in response to the output of the delay circuit, said pre-sense amplifier being enabled or disabled.

7. The semiconductor memory device according to claim 6, wherein said main sense amplifier is enabled after said pre-sense amplifier is enabled.

8. A semiconductor memory device including a memory cell array having a plurality of memory cells connected to multiple word lines and between multiple pairs of bit lines, wherein said plurality of memory cells are divided into a predetermined number of blocks, said semiconductor memory device comprising:

a main sense amplifier for reading cell information onto a pair of said bit lines from one memory cell selected via each word line and for outputting the read cell information after amplification;

a pre-sense amplifier, connected to each pair of bit lines and provided for each block, said pre-sense amplifier being enabled when the memory cell in each block is selected, for amplifying a potential difference between the pair of bit lines based on the cell information and for outputting the amplified potential difference via the pair of bit lines to the main sense amplifier prior to outputting of the read data; and a delay circuit for outputting a signal with a delay used for selecting the memory cell in said block, in response to the output of the delay circuit, said pre-sense amplifier being enabled.

9. The semiconductor memory device according to claim 8, wherein said main sense amplifier is enabled after said pre-sense amplifier is enabled.

10. The semiconductor memory device according to claim 9, wherein said pre-sense amplifier includes a flip-flop circuit having two CMOS inverter circuits connected in loop.

11. The semiconductor memory device according to claim 8, wherein said delay circuit enables said pre-sense amplifier and then disables said pre-sense amplifier in a predetermined interval.

12. A semiconductor memory device including a memory cell array having a plurality of memory cells connected to multiple word lines and between multiple pairs of bit lines, wherein said plurality of memory cells are divided into a predetermined number of blocks, said semiconductor memory device comprising:

a main sense amplifier for reading cell information onto a pair of said bit lines from one memory cell selected via each word line and for outputting the read cell information after amplification;

a pre-sense amplifier, connected to each pair of bit lines and provided for each block, said pre-sense amplifier being enabled when the memory cell in each block is selected, for amplifying a potential difference between the pair of bit lines based on the cell information and for outputting the amplified potential difference to the main sense amplifier prior to outputting of the read data; and a delay circuit for outputting a signal with a delay used for selecting the memory cell in said block, in response to the output of the delay circuit, said pre-sense amplifier being enabled, wherein said main sense amplifier is enabled after said pre-sense amplifier is enabled, and wherein as a distance of each pre-sense amplifier from the main sense amplifier becomes greater, a load drive performance of the pre-sense amplifier becomes greater.

13. The semiconductor memory device according to claim 12, wherein said pre-sense amplifier includes a flip-flop circuit having two CMOS inverter circuits connected in loop.

14. The semiconductor memory device according to claim 12, wherein said delay circuit enables said pre-sense amplifier and then disables said pre-sense amplifier in a predetermined interval.

15. A semiconductor memory device including a memory cell array having a plurality of memory cells connected to multiple word lines and between multiple pairs of bit lines, said semiconductor memory device comprising:

a main sense amplifier for reading cell information onto a pair of said bit lines from one memory cell selected via each word line and for outputting the read cell information after amplification; and a pre-sense amplifier, connected to each pair of bit lines, for amplifying a potential difference between the pair of bit lines based on the cell information and for outputting the amplified potential difference to the main sense amplifier prior to outputting of the read data, wherein as a distance of each pre-sense amplifier from the main sense amplifier becomes greater, a load drive performance of the pre-sense amplifier becomes greater.

16. The semiconductor memory device according to claim 15, wherein said plurality of memory cells are divided into a predetermined number of blocks, each block having said pre-sense amplifier that is enabled to amplify the potential difference between the pair of bit lines when the memory cell in each block is selected.

17. The semiconductor memory device according to claim 16, wherein said pre-sense amplifier includes a flip-flop circuit having two CMOS inverter circuits connected in loop.

18. The semiconductor memory device according to claim 16, wherein said pre-sense amplifier is connected to the memory cells in the block via the pair of bit lines and has a delay circuit for outputting a signal with a delay used for selecting the memory cell in said block, in response to the output of the delay circuit, said pre-sense amplifier being enabled or disabled.

19. The semiconductor memory device according to claim 18, wherein said main sense amplifier is enabled after said pre-sense amplifier is enabled.

20. A semiconductor memory device comprising:

an array having a plurality of memory cells connected between a plurality of word lines and a plurality of bit line pairs, wherein the plurality of memory cells are divided into a predetermined number of blocks, and wherein one block is defined by one bit line pair and a predetermined number of word lines;

a row decoder connected to the plurality of word lines for selecting one of the plurality of word lines;

a column selector connected to the plurality of bit line pairs for selecting one of the plurality of bit line pairs;

pre-sense amplifiers, each connected between one bit line pair in each block, for amplifying a potential difference between the associated bit line pair based on cell information read from the memory cell, which is associated with the selected word line and bit line, and outputting the amplified potential difference to the associated bit line pair; and a main sense amplifier, connected the column selector via a sub-bit line pair, for receiving the amplified potential difference on the selected bit line pair via the sub-bit line pair and further amplifying the amplified potential difference to output the cell information, wherein the selected bit line pair and the sub-bit line form one bit line pair to the main sense amplifier.

21. The semiconductor memory device according to claim 20 further comprising delay circuits, connected to the pre-sense amplifier, respectively, each outputting a signal with a delay used for selecting the memory cell in said block, in response to the output of the associated delay circuit, the pre-sense amplifier being enabled or disabled.

22. The semiconductor memory device according to claim 1, wherein the main sense amplifier is enabled after the pre-sense amplifier is enabled.

* * * * *